(12) United States Patent
Yeh et al.

(10) Patent No.: US 12,254,949 B2
(45) Date of Patent: Mar. 18, 2025

(54) MEMORY DEVICE

(71) Applicant: MACRONIX International Co., Ltd., Hsinchu (TW)

(72) Inventors: Teng-Hao Yeh, Hsinchu County (TW); Hang-Ting Lue, Hsinchu (TW); Chih-Wei Hu, Miaoli County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 188 days.

(21) Appl. No.: 18/314,153

(22) Filed: May 9, 2023

(65) Prior Publication Data

US 2024/0379136 A1    Nov. 14, 2024

(51) Int. Cl.
| | | |
|---|---|---|
| G11C 7/00 | (2006.01) | |
| G11C 5/06 | (2006.01) | |
| G11C 7/06 | (2006.01) | |
| G11C 16/08 | (2006.01) | |
| H01L 23/00 | (2006.01) | |
| H01L 25/065 | (2023.01) | |
| H10B 41/20 | (2023.01) | |
| H10B 41/40 | (2023.01) | |
| H10B 43/20 | (2023.01) | |

(Continued)

(52) U.S. Cl.
CPC ............ *G11C 7/06* (2013.01); *G11C 5/063* (2013.01); *G11C 16/08* (2013.01); *H01L 24/05* (2013.01); *H01L 24/16* (2013.01); *H01L 25/0657* (2013.01); *H10B 41/20* (2023.02); *H10B 41/40* (2023.02); *H10B 43/20* (2023.02); *H10B 43/40* (2023.02); *H10B 80/00* (2023.02); *H01L 2224/0556* (2013.01); *H01L 2224/16146* (2013.01); *H01L 2225/06541* (2013.01)

(58) Field of Classification Search
None
See application file for complete search history.

(56) References Cited

U.S. PATENT DOCUMENTS

| 9,691,478 B1 | 6/2017 | Lin et al. |
|---|---|---|
| 10,847,523 B1 | 11/2020 | Yeh et al. |

(Continued)

FOREIGN PATENT DOCUMENTS

| JP | 2020191149 | 11/2020 |
|---|---|---|
| JP | 2021111789 | 8/2021 |

(Continued)

OTHER PUBLICATIONS

"Office Action of Korea Counterpart Application", issued on Nov. 28, 2024, p. 1-p. 7.

(Continued)

*Primary Examiner* — Tan T. Nguyen
(74) *Attorney, Agent, or Firm* — J.C. PATENTS (57) ABSTRACT

A memory device, such as a three-dimensional AND or NOR flash memory, includes a first chip and a second chip. The first chip has multiple source line switches, multiple bit line switches, multiple page buffers, and multiple sensing amplifiers. The first chip has multiple first pads. The second chip has multiple memory cells to form multiple memory cell blocks. Multiple second pads are on a first surface of the second chip to be respectively coupled to multiple local bit lines and multiple local source lines of the memory cell blocks. Each of the first pads is coupled to the corresponding second pads.

14 Claims, 10 Drawing Sheets

(51) Int. Cl.
   *H10B 43/40*   (2023.01)
   *H10B 80/00*   (2023.01)

(56)  References Cited

U.S. PATENT DOCUMENTS

| | | |
|---|---|---|
| 2011/0255347 A1 | 10/2011 | Mori et al. |
| 2011/0309475 A1 | 12/2011 | Lee |
| 2021/0065801 A1* | 3/2021 | Kwon .................... G11C 16/26 |
| 2021/0066281 A1* | 3/2021 | Kwon ................. H01L 25/0657 |
| 2022/0181283 A1 | 6/2022 | Hosoda et al. |
| 2022/0399362 A1 | 12/2022 | Mizutani et al. |
| 2023/0074030 A1 | 3/2023 | Maejima et al. |
| 2023/0111844 A1 | 4/2023 | Oh et al. |

FOREIGN PATENT DOCUMENTS

| | | |
|---|---|---|
| JP | 2022081399 | 5/2022 |
| JP | 2022189117 | 12/2022 |
| JP | 2023036342 | 3/2023 |
| KR | 20180040479 | 4/2018 |
| KR | 20210003351 | 1/2021 |
| KR | 20210028438 | 3/2021 |
| KR | 20210110861 | 9/2021 |
| KR | 20220060379 | 5/2022 |
| TW | 201232547 | 8/2012 |
| TW | 202115737 | 4/2021 |

OTHER PUBLICATIONS

"Notice of allowance of Japan Counterpart Application", issued on Dec. 13, 2024, p. 1-p. 3.
"Office Action of Japan Counterpart Application", issued on Jul. 30, 2024, pp. 1-5.
"Search Report of Europe Counterpart Application", issued on Nov. 24, 2023, p. 1-p. 11.
"Office Action of Taiwan Counterpart Application", issued on Dec. 6, 2023, p. 1-p. 5.

* cited by examiner

MEMORY DEVICE

BACKGROUND

Technical Field

The disclosure relates to a memory device, and in particular to a memory device formed by stacking multiple chips.

Description of Related Art

In a three-dimensional AND flash memory, several memory blocks may share a sensing amplifier to save an area of a circuit layout. However, in this way, the number of sensing amplifiers affects an access bandwidth of the memory.

In related art, the design of the small-sized memory cell block may speed up the access rate of the memory cell. However, the practice of sharing one sensing amplifier with multiple memory cell blocks results in a long length of a global bit line and an excessively high signal transmission impedance. The excessively high signal transmission impedance is often the bottleneck of the data sensing speed of the memory and causes the reading efficiency to be unable to be effectively improved.

SUMMARY

The disclosure provides a memory device, which can effectively reduce the transmission impedance of a sensing amplifier coupled to a global bit line between memory cells.

The memory device of the disclosure includes a first chip and a second chip. The first chip has a plurality of source line switches, a plurality of bit line switches, multiple page buffers, and a plurality of sensing amplifiers. The first chip has a plurality of first pads. The second chip has a plurality of memory cells to form multiple memory cell blocks. A first surface of the second chip has a plurality of second pads to be respectively coupled to a plurality of local bit lines and a plurality of local source lines of the memory cell blocks. Each of the first pads is coupled to the corresponding second pads.

Based on the above, the memory device of the disclosure is formed by combining two different chips. The source line switches, the bit line switches, the page buffers, and the sensing amplifiers are disposed in the first chip, and the memory cell blocks are disposed in the second chip. Through coupling the multiple first pads on the first chip to the multiple second pads on the second chip, a whole circuit loop of the memory device may be completed. In addition, the sensing amplifiers may be electrically connected to the global bit lines of corresponding memory cell blocks through the first pads and the second pads, reducing the length and the transmission impedance of the global bit lines, improving the working efficiency of the memory device.

DESCRIPTION OF THE EMBODIMENTS

Figure 1:
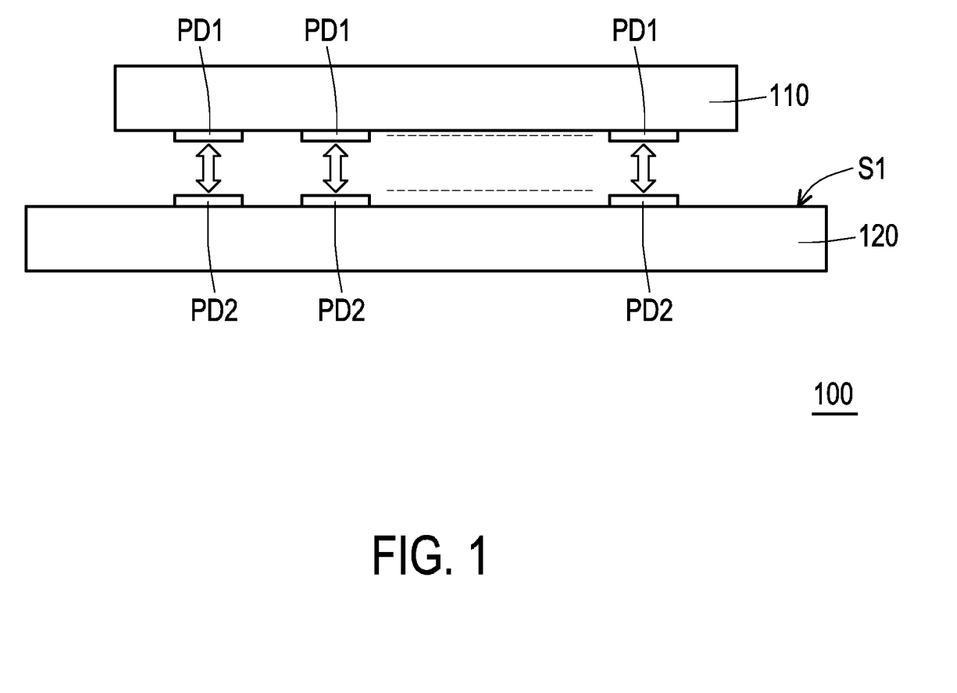
FIG. 1 illustrates a schematic view of a memory device according to an embodiment of the disclosure.

Please refer to FIG. 1. FIG. 1 illustrates a schematic view of a memory device according to an embodiment of the disclosure. A memory device 100 includes a first chip 110 and a second chip 120. The first chip 110 has a plurality of source line switches, a plurality of bit line switches, a plurality of page buffers, and a plurality of sensing amplifiers. The plurality of source line switches may be divided into a plurality of source line switch groups. The plurality of bit line switches may be divided into a plurality of bit line switch groups. Each of the sensing amplifiers corresponds to each of the source line switch groups, each of the bit line switch groups, and each of the page buffers. In terms of coupling relationship, each of the sensing amplifiers is coupled to the corresponding page buffer, and is coupled to the corresponding bit line switch through a corresponding global bit line.

In this embodiment, a plurality of pads PD1 may be formed on the first chip 110. A part of the pads PD1 may, for example, be coupled to a first end of the corresponding bit line switch, and another part of the pads PD1 may, for example, be coupled to a first end of the corresponding source line switch. A second end of the bit line switch may be coupled to the corresponding global bit line. A second end of the source line switch may receive a reference voltage, such as a reference ground voltage.

On the other hand, the second chip 120 has a plurality of memory cells to form a plurality of memory cell blocks. Each of the memory cell blocks may correspond to each of the sensing amplifiers on the first chip 110. A plurality of pads PD2 may be formed on a first surface S1 of the second chip 120. A Part of the pads PD2 may be coupled to local bit lines of each of the memory cell blocks, and another part of the pads PD2 may be coupled to local source lines of each of the memory cell blocks.

In this embodiment, through electrically coupling the respective pads PD1 to the pads PD2 correspondingly, each of the sensing amplifiers on the first chip 110 may be coupled to each of the memory cell blocks on the second chip 120 correspondingly through the corresponding source line switch group and the bit line switch group. The construction of a whole circuit loop of the memory device 100 may be completed.

Incidentally, the details of circuits of the memory device 100 will be further explained in subsequent embodiments.

It should be noted that the memory device 100 of the disclosure divides circuit elements to be disposed in the first chip 110 and the second chip 120 respectively. In this way, the density of the circuit elements in the first chip 110 and the second chip 120 may be effectively reduced. In this way, the complexity of a circuit layout of the first chip 110 and the second chip 120 may be reduced, and unexpected parasitic effects generated between the circuit elements may also be reduced, effectively improving the working efficiency of the memory device 100.

Figure 2:
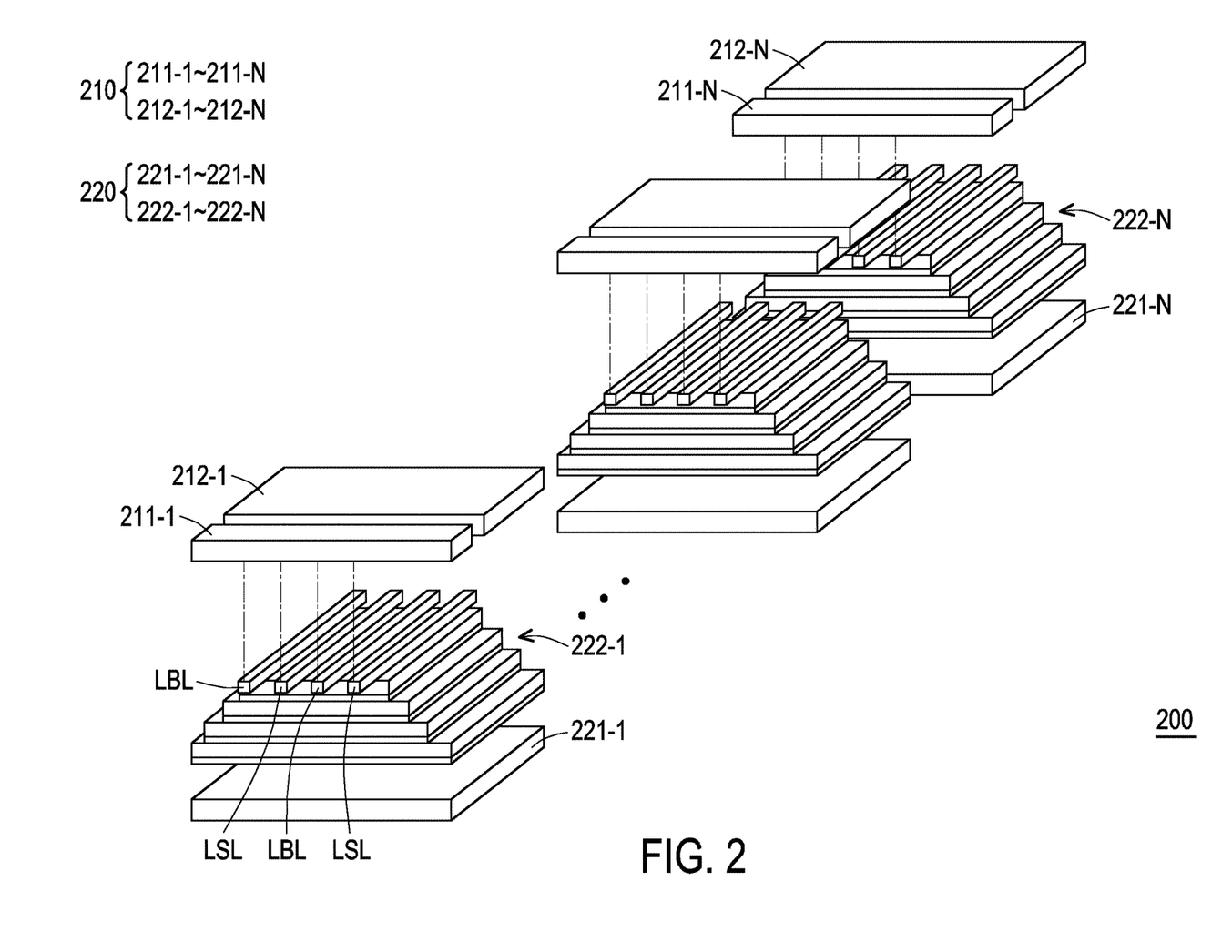
FIG. 2 illustrates a schematic view of a three-dimensional structure of a memory device according to an embodiment of the disclosure.

Below, please refer to FIG. 2. FIG. 2 illustrates a schematic view of a three-dimensional structure of a memory device according to an embodiment of the disclosure. A memory device 200 includes a first chip 210 and a second chip 220. The first chip 210 includes circuit blocks 211-1 to 211-N and circuit blocks 212-1 to 212-N. The second chip 220 includes circuit blocks 221-1 to 221-N and circuit blocks 222-1 to 222-N. In the first chip 210, each of the circuit blocks 212-1 to 212-N is configured to dispose the sensing amplifier and the corresponding page buffer. Each of the circuit blocks 211-1 to 211-N is configured to dispose the corresponding bit line switch group and the source line switch group. In the second chip 220, each of the circuit blocks 221-1 to 221-N is configured to dispose an X address sensor, and each of the circuit blocks 222-1 to 222-N is configured to dispose the memory cell block corresponding to the X address sensor. In this embodiment, the circuit blocks 222-1 to 222-N configured to dispose the memory cell blocks are respectively stacked above the circuit blocks 221-1 to 221-N configured to dispose the X address sensors.

On the other hand, taking the circuit block 222-1 as an example, multiple local bit lines LBL and a plurality of local source lines LSL are on the memory cell block in the circuit block 222-1. Each of the local bit lines LBL and each of the local source lines LSL are disposed in an interleaved manner, and the local bit lines LBL and the local source lines LSL are parallel to each other. A plurality of pads may be formed on each local bit line LBL and each local source line LSL. The second chip 220 may be electrically coupled to the plurality of pads on the first chip 210 through the plurality of pads, and allow the local bit lines LBL and local source lines LSL on the memory cell block to be respectively electrically coupled to the corresponding bit line switch group and the source line switch group.

In this embodiment, the first chip 210 and the second chip 220 are attached to each other in a vertical direction to complete the electrical coupling. In such a state, the sensing amplifiers and the corresponding page buffers in each circuit block 212-1 to 212-N may be stacked above the corresponding memory cell block in each circuit block 221-1 to 221-N, and the bit line switch group and the source line switch group in each circuit block 211-1 to 211-N may also be stacked above the memory cell block of each circuit block 221-1 to 221-N correspondingly.

In this embodiment, each memory cell block has a respective corresponding sensing amplifier, and is stacked in the vertical direction. In this way, a length of the global bit line that completes the electrical connection between the memory cell block and the corresponding sensing amplifier may be effectively shortened, greatly reducing the signal transmission resistance between the memory cell block and the corresponding sensing amplifier, improving the working efficiency of the memory device 200.

Figure 3:
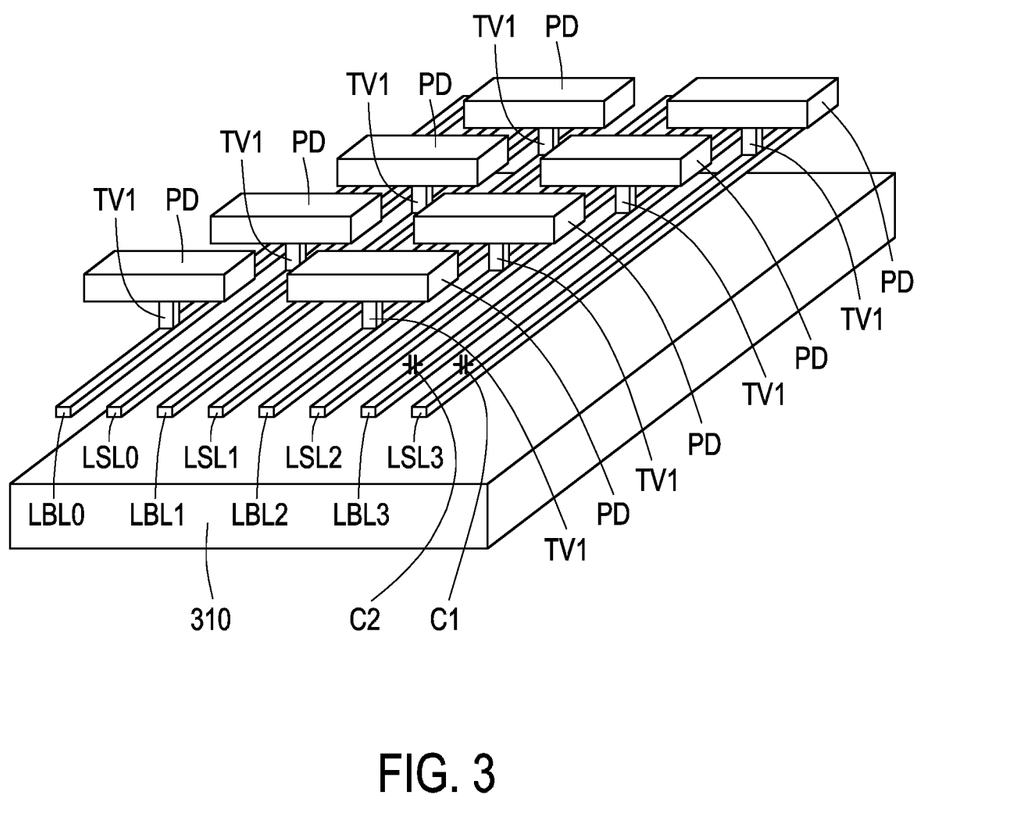
FIG. 3 illustrates a three-dimensional schematic view of a structure of pads of a memory device according to an embodiment of the disclosure.

Below, please refer to FIG. 3. FIG. 3 illustrates a three-dimensional schematic view of a structure of pads of a memory device according to an embodiment of the disclosure. In FIG. 3, the second chip is taken as an example. In the second chip, a plurality of local bit lines LBL0 to LBL3 and a plurality of local source lines LSL0 to LSL3 may be disposed on a memory cell block 310. The local bit lines LBL0 to LBL3 and the local source lines LSL0 to LSL3 are respectively disposed in an interleaved manner. The local bit lines LBL0 to LBL3 and the local source lines LSL0 to LSL3 may have the same size, and each local bit line LBL0 to LBL3 and each local source lines LSL0 to LSL3, which are adjacent, may have the same spacing. In this way, a parasitic capacitance (such as capacitances C1 and C2) formed between each local bit line LBL0 to LBL3 and each local source line LSL0 to LSL3 may have substantially the same capacitance value (there may still be some differences between the parasitic capacitances based on errors in the manufacturing process). Thereby, the data transmission quality on the local bit lines LBL0 to LBL3 and the local source lines LSL0 to LSL3 may be maintained.

In this embodiment, the local bit lines LBL0 to LBL3 and the local source lines LSL0 to LSL3 may be formed through a first layer (TM1) of a top metal layer.

On the other hand, a plurality of pads PD may be disposed at positions above the corresponding local bit lines LBL0 to LBL3 and the local source lines LSL0 to LSL3. The a plurality of pads PD are electrically coupled to the corresponding local bit lines LBL0 to LBL3 and the local source lines LSL0 to LSL3 respectively through a plurality of conductive vias TV1. The pads PD may be regularly disposed above the local bit lines LBL0 to LBL3 and the local source lines LSL0 to LSL3, distances in a horizontal direction and a vertical direction between the two pads PD corresponding to the adjacent local bit lines LBL0 to LBL3 and the local source lines LSL0 to LSL3 may be fixed.

In this embodiment, the pad PD may be formed through, for example, a second layer (TM2) of the top metal layer.

It is worth mentioning that the disposition method of the pads on the first chip may also be disposed according to the implementation method shown in FIG. 3, and will not be repeated here.

Figure 4:
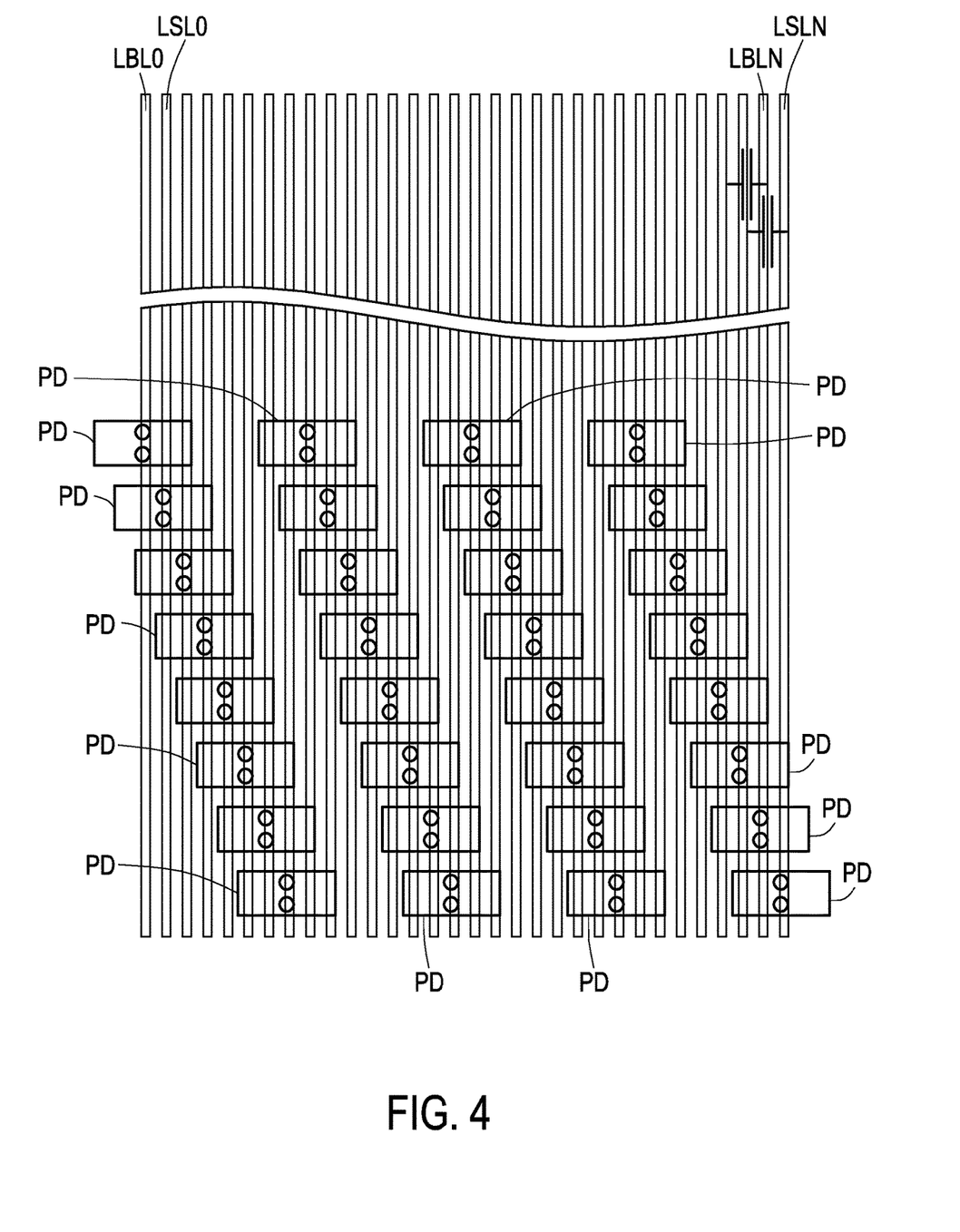
FIG. 4 illustrates a schematic top view of pads of a memory device according to an embodiment of the disclosure.

Below, please refer to FIG. 4. FIG. 4 illustrates a schematic top view of pads of a memory device according to an embodiment of the disclosure. In FIG. 4, a plurality of local bit lines LBL0 to LBLN and a plurality of local source lines LSL0 to LSLN are disposed in an interleaved and parallel manner, and may cover the memory cell block (not illustrated). The local bit lines LBL0 to LBLN and the local source lines LSL0 to LSLN may have the same size, and each local bit line LBL0 to LBLN and each local source line LSL0 to LSLN, which are adjacent, have the same spacing and form parasitic capacitances having substantially the same capacitance value.

A plurality of pads PD are respectively disposed above the local bit lines LBL0 to LBLN and the local source lines LSL0 to LSLN, and are respectively electrically connected to the local bit lines LBL0 to LBLN and the local source lines LSL0 to LSLN through conductive vias.

Figure 5:
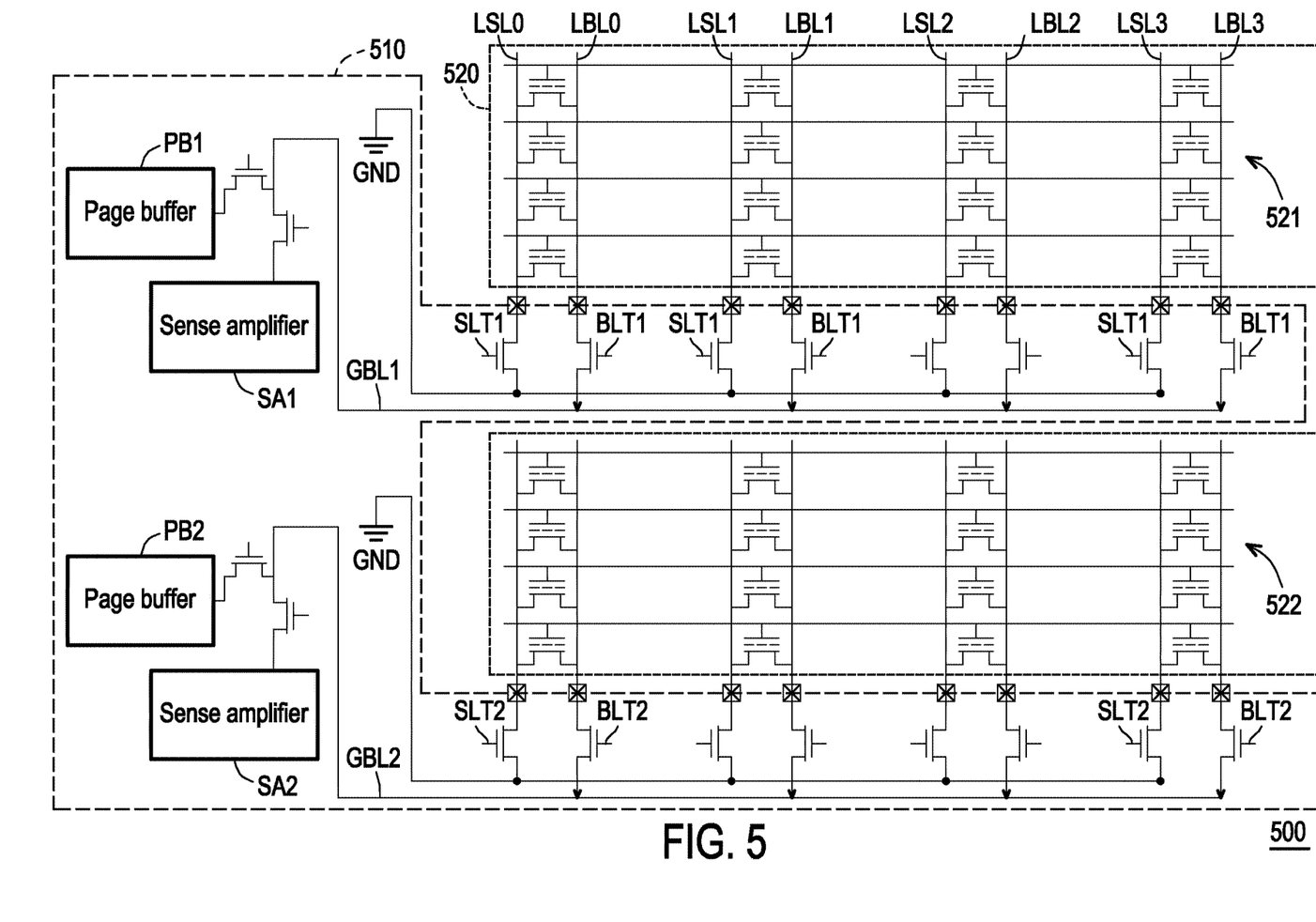
FIG. 5 illustrates a schematic view of circuits of a memory device according to an embodiment of the disclosure.

Below, please refer to FIG. 5. FIG. 5 illustrates a schematic view of circuits of a memory device according to an embodiment of the disclosure. In FIG. 5, a memory device 500 includes a first chip 510 and a second chip 520. The first chip 510 has sensing amplifiers SA1, SA2, page buffers PB1, PB2, a plurality of bit line switches BLT1, BLT2, and a plurality of source line switches SLT1, SLT2. The sensing amplifier SA1 is coupled to the page buffer PB1 and coupled to the bit line switches BLT1. The sensing amplifier SA2 is coupled to the page buffer PB2 and coupled to the bit line switches BLT2. The plurality of source line switches SLT1, SLT2 are not coupled to endpoints of the first chip 510 and may be coupled to ground ends to receive reference ground voltages GND.

The second chip 520 includes a plurality of memory cell blocks 521, 522. Taking the memory cell block 521 as an example, the memory cell block 521 has a plurality of local bit lines LBL0 to LBL3 and a plurality of local source lines LSL0 to LSL3. In this embodiment, the local bit lines LBL0 to LBL3 are respectively coupled to different bit line switches BLT1 through a plurality of connection structures PDA, and the local source lines LSL0 to LSL3 are also respectively coupled to different source lines switches SLT1 through the plurality of connection structures PDA. Each connection structure PDA is two pads coupled to each other on the first chip 510 and the second chip 520.

Incidentally, the memory cell blocks 521, 522 may include three-dimensionally stacked AND or NOR flash memory cell arrays.

In this embodiment, the sensing amplifiers SA1, SA2 may be implemented by using any sensing amplifier circuits that are well known to persons skilled in the art and applied to the memory. The page buffers PB1, PB2 may be digital circuits, and may be implemented by any page buffer circuits that are well known to persons skilled in the art and applied to the memory without limitations.

Figure 6:
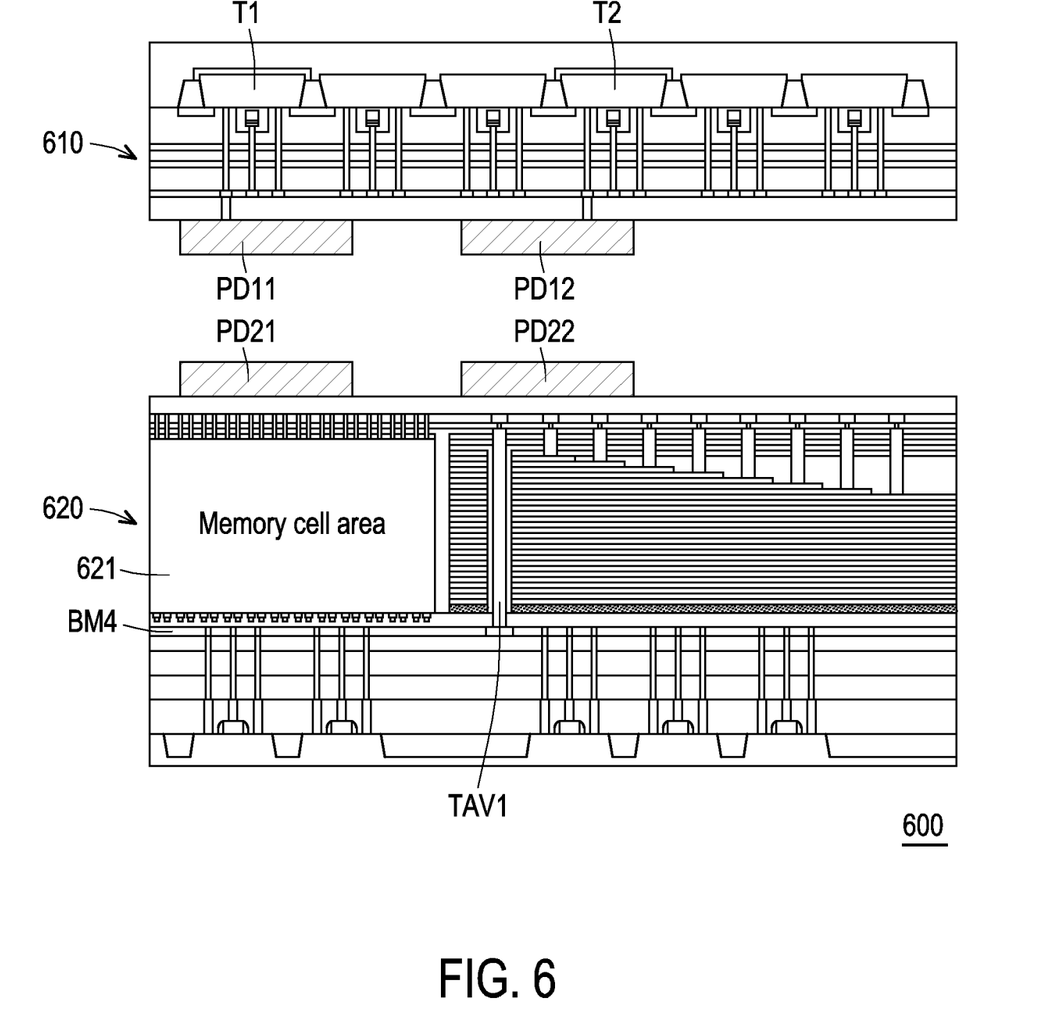
FIG. 6 illustrates a schematic view of a cross-sectional structure of a memory device according to an embodiment of the disclosure.

Please refer to FIG. 6. FIG. 6 illustrates a schematic view of a cross-sectional structure of a memory device according to an embodiment of the disclosure. A memory device 600 includes a first chip 610 and a second chip 620. The first chip 610 has a plurality of sensing amplifiers, a plurality of bit line switches, a plurality of source line switches, and a plurality of page buffers. In FIG. 6, the first chip 610 has transistors T1, T2. The transistors T1, T2 are configured to construct the bit line switch, the source line switch, or other control circuits. An end (a source or a drain) of the transistor T1 may be coupled to a pad PD11, and an end of the transistor T2 (a source or a drain) may be coupled to a pad PD12.

On the other hand, the second chip 620 has a memory cell area 621. The memory cell area 621 may have a plurality of memory cell blocks. The local bit line or the local source line of the memory cell block may be coupled to a pad PD21. The pad PD21 may be electrically coupled to the opposite pad PD11, and allow the transistor T1 used as the source line switch or the bit line switch in the first chip 610 may be connected to the local source line or the local bit line in the second chip 620.

Incidentally, the second chip 620 may further include a through-silicon via TAV1. An end of the through-silicon via TAV1 is coupled to a bottom metal layer BM4 of the second chip 620 and penetrates a word line area of the second chip 620 to connect to a pad PD22. The pad PD22 may be electrically coupled to the opposite pad PD12, and allow the transistor T2 in the first chip 610 to perform a signal transmission operation with the second chip 620.

Incidentally, in this embodiment, an X address decoder may be disposed below the bottom metal layer BM4. The X address decoder may perform a position decoding operation and provide access address information to the memory cell area 621.

Figure 7:
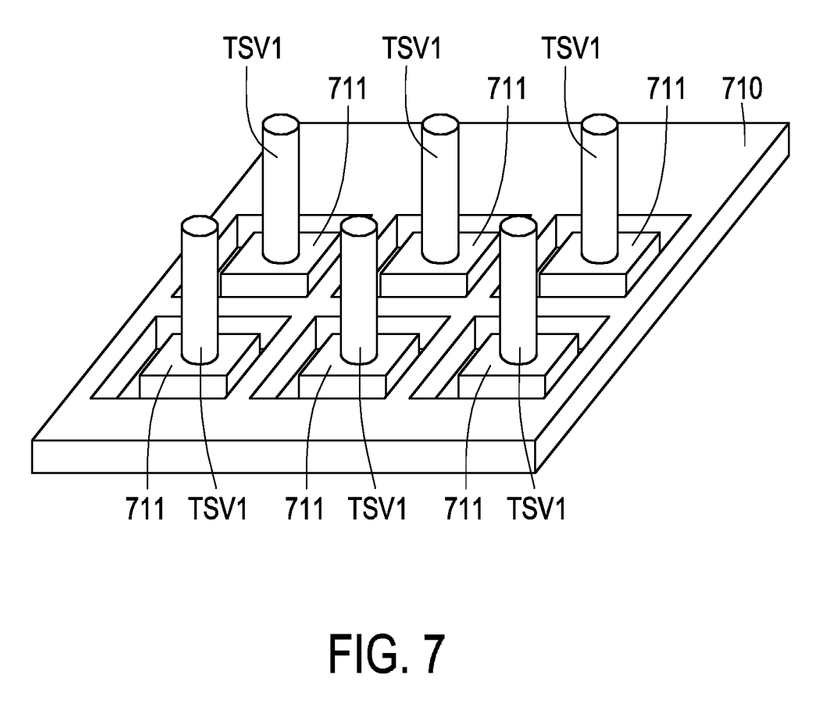
FIG. 7 to FIG. 9 illustrate schematic views of a structure of a connection method of a peripheral circuit of a memory device according to an embodiment of the disclosure.
Figure 8:
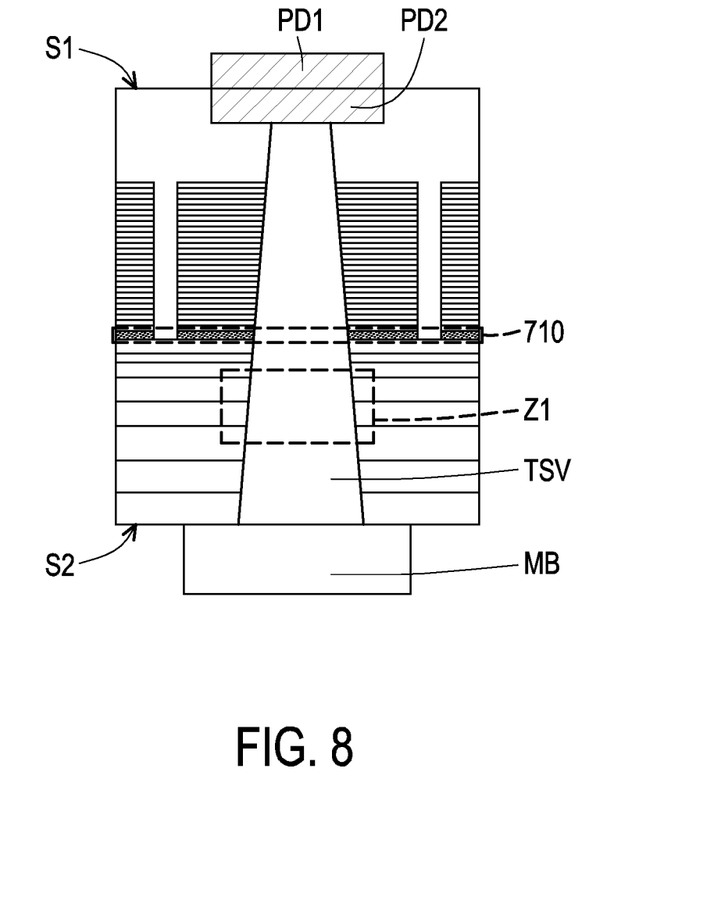
Figure 9:
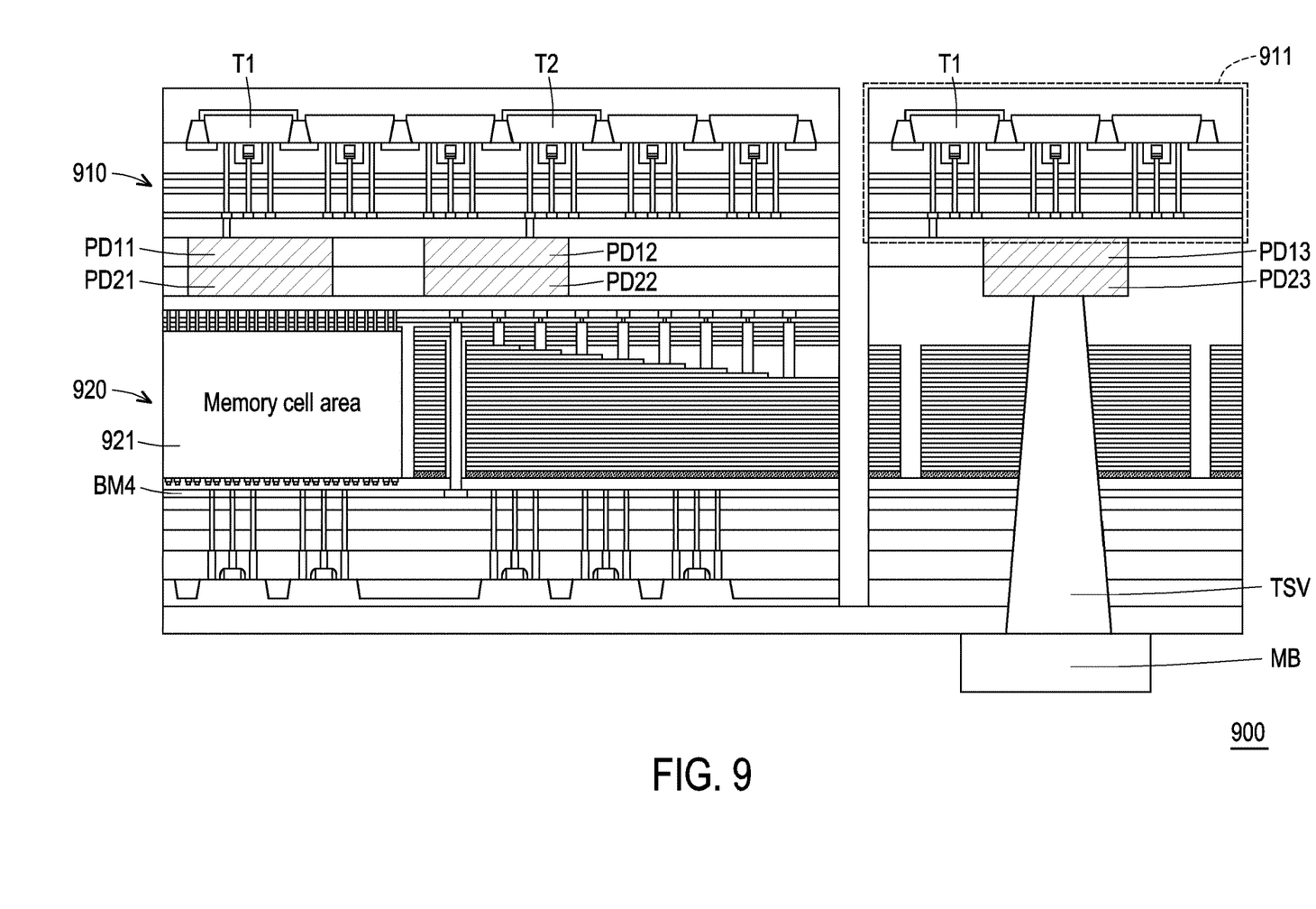

Below, please refer to FIG. 7 to FIG. 9. FIG. 7 to FIG. 9 illustrate schematic views of a structure of a connection method of a peripheral circuit of a memory device according to an embodiment of the disclosure. In the embodiment of the disclosure, the first chip of the memory device further includes a peripheral circuit. The peripheral circuit may perform the signal transmission operation with an external electronic device, and perform multiple control operations related to memory device access operations.

In this embodiment, the peripheral circuit may be coupled to multiple through-silicon vias and transmit and receive multiple control signals and power signals with the external electronic device through the multiple through-silicon vias. The through-silicon vias are formed in the second chip and penetrate the second chip to be electrically connected to the peripheral circuit in the first chip.

In a three-dimensional view in FIG. 7, a ground poly layer 710 may generate a plurality of divisional islands 711 through an etching operation on the ground poly layer 710 in a peripheral area of the second chip. The plurality of divisional islands 711 are physically separated from each other. In addition, in the second chip, a plurality of through-silicon vias TSV may be generated on the divisional islands 711. Since the divisional islands 711 are physically separated from each other and physically separated from the ground poly layer 710, an electrical separation effect may be generated between the through-silicon vias TSV.

In a cross-sectional view in FIG. 8, the through-silicon via TSV penetrates the divisional island 711 and is coupled between the pad PD2 and a conductive bump MB. The conductive bump MB is formed on a second surface S2 of the second chip, and the pad PD2 is formed on a first surface S1 of the second chip, in which the first surface S1 is opposite to the second surface S2. It is worth noting that when penetrating the second chip, the through-silicon vias TSV penetrate a circuit-free area Z1 of the second chip to avoid generating a signal transmission conflict with an internal circuit of the second chip.

In addition, the pad PD2 is configured to be electrically coupled to the pad PD1 on the first chip. The pad PD1 on the first chip may be electrically coupled to the peripheral circuit in the first chip. In this way, the external electronic device may perform the signal transmission operation with the peripheral circuit of the first chip by using a signal transmission path formed by the through-silicon via TSV and the pads PD2, PD1 through the conductive bump MB.

According to a schematic cross-sectional view of a memory device in FIG. 9, it may be known that in a memory device 900, a first chip 910 has a peripheral circuit area 911 and a non-peripheral circuit area. The peripheral circuit area 911 is configured to dispose the peripheral circuit, and the non-peripheral circuit area is configured to dispose the sensing amplifier, the page buffer, the source line switch, and the bit line switch. The first chip 910 has pads PD11, PD12, and PD13. A second chip 920 has a memory cell area 921. The memory cell area 921 has a plurality of memory cell blocks. Pads PD21, PD22, and PD23 are on a surface opposite to the first chip 910 of the second chip 920. The pads PD21, PD22, and PD23 on the second chip 920 are electrically coupled to the pads PD11, PD12, and PD13 on the first chip 910 respectively.

The pad PD11 is configured to connect to the bit line switch or the source line switch in the first chip 910, and the pad PD21 is configured to connect to the local bit line or the local source line of the memory cell block in the second chip 920. The pad PD12 may be connected to any transistor in the first chip 910, and the pad PD22 may be connected to any metal layer in the second chip 920. The pad PD13 may be connected to the peripheral circuit in the first chip 910, and the pad PD23 may be connected to the through-silicon via TSV formed in the second chip 920. The through-silicon via TSV penetrates the second chip 920 and is coupled to the conductive bump MB formed on another surface of the second chip 920.

Figure 10:
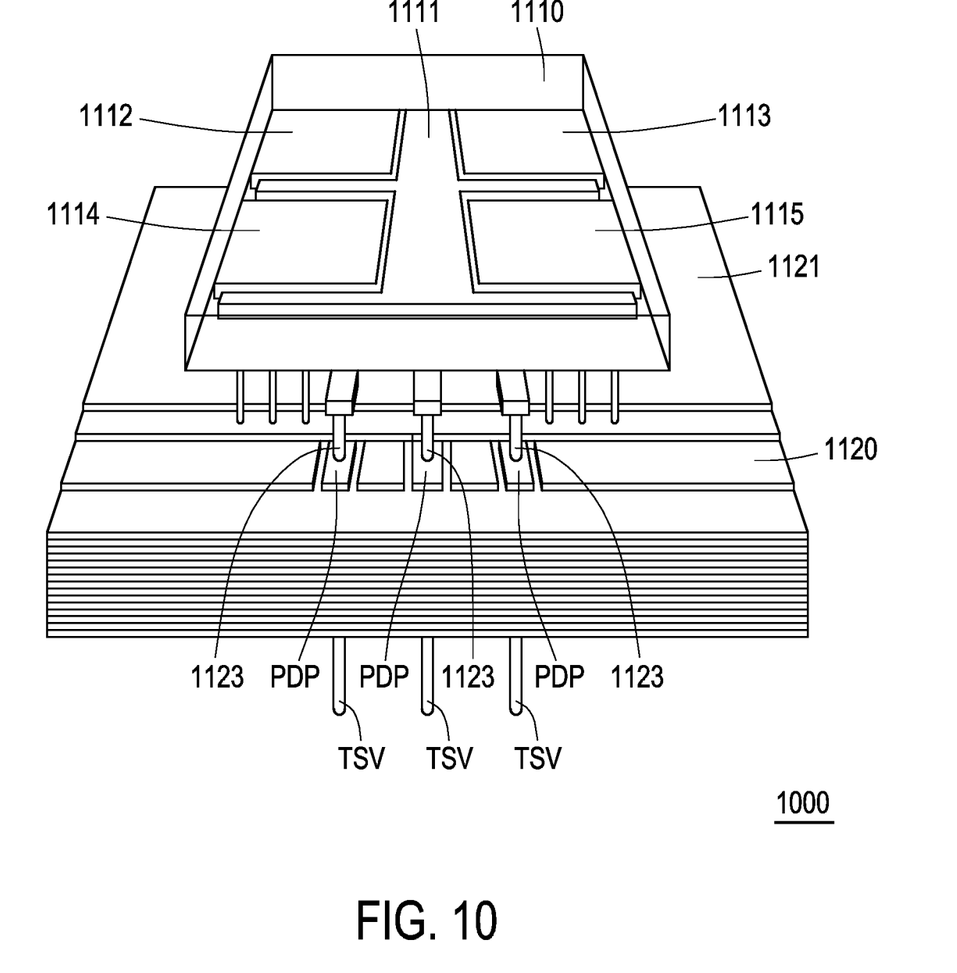
FIG. 10 illustrates a schematic view of a three-dimensional structure of a memory device according to an embodiment of the disclosure.

Please refer to FIG. 10. FIG. 10 illustrates a schematic view of a three-dimensional structure of a memory device according to an embodiment of the disclosure. A memory device 1000 includes a first chip 1110 and a second chip 1120. The first chip 1110 covers the second chip 1120. The first chip 1110 has a peripheral circuit area 1111 and non-peripheral circuit areas 1112 to 1115. The peripheral circuit area 1111 is configured to dispose the peripheral circuit. The non-peripheral circuit areas 1112 to 1115 are configured to dispose the sensing amplifiers, the page buffers, the source line switches, and the bit line switches.

The first chip 1110 covers an area of a memory cell area 1121 and is electrically coupled to a plurality of pads on the second chip 1120 through the a plurality of pads. The peripheral circuit is electrically coupled to a plurality of through-silicon vias TSV in the second chip 1120 through pads PDP. The through-silicon vias TSV may penetrate a plurality of divisional islands 1123 formed on the ground poly layer in the second chip 1120.

In summary, in the memory device of the disclosure, the sensing amplifier, the page buffer, the source line switch, and the bit line switch are disposed in the first chip, and the memory cell block is disposed in the second chip. Multiple pads are respectively formed on the first chip and the second chip, and a whole memory device is formed through electrically coupling the multiple pads on the first chip and the second chip to each other. Accordingly, in the memory device, each memory cell block has the respective corresponding sensing amplifier. Moreover, the sensing amplifier may be connected to the corresponding memory cell block through the pad, and the length of a transmission wire in between may be effectively shortened, reducing the signal transmission impedance and improving the working efficiency of the memory device.

What is claimed is:

1. A memory device, comprising:
a first chip having a plurality of source line switches, a plurality of bit line switches, a plurality of page buffers, and a plurality of sensing amplifiers, wherein the first chip has a plurality of first pads; and
a second chip having a plurality of memory cells to form a plurality of memory cell blocks, wherein a first surface of the second chip has a plurality of second pads to be respectively coupled to a plurality of local bit lines and a plurality of local source lines of the plurality of memory cell blocks,
wherein each of the first pads is coupled to the corresponding each second pad.

2. The memory device according to claim 1, wherein the second chip has a plurality of X address decoders corresponding to the plurality of memory cell blocks respectively.

3. The memory device according to claim 1, wherein the plurality of source line switches are divided into a plurality of source line switch groups, the plurality of bit line switches are divided into a plurality of bit line switch groups, and each of the plurality of source line switch groups and each of the plurality of bit line switch groups correspond to each of the memory cell blocks.

4. The memory device according to claim 3, wherein each of the memory cell blocks corresponds to each of the X address decoders respectively.

5. The memory device according to claim 4, wherein each of the memory cell blocks are stacked with the corresponding source line switch group, the corresponding bit line switch group, the corresponding sensing amplifier, and the corresponding X address decoder.

6. The memory device according to claim 3, wherein each of the sensing amplifiers is coupled to the corresponding each page buffer and the corresponding each bit line switch group.

7. The memory device according to claim 1, wherein the plurality of local bit lines and the plurality of local source lines have the same size, and each of the local bit lines and the adjacent local source lines have substantially same parasitic capacitance value.

8. The memory device according to claim 7, wherein the plurality of second pads are formed above the plurality of local bit lines and the plurality of local source lines respectively, and electrically coupled to the plurality of local bit lines and the plurality of local source lines through a plurality of conductive vias.

9. The memory device according to claim 1, wherein each of the local bit lines and each of the local source lines are alternatively disposed above the corresponding memory cell block in parallel.

10. The memory device according to claim 1, further comprising:
a peripheral circuit disposed in the first chip and coupled to a plurality of through-silicon vias, and transmitting and receiving a plurality of control signals and power signals with an external electronic device through the plurality of through-silicon vias.

11. The memory device according to claim 10, wherein the plurality of through-silicon vias penetrate a circuit-free area of the second chip.

12. The memory device according to claim 10, wherein a plurality of divisional islands are formed on a ground poly layer of the second chip, and the plurality of through-silicon vias penetrate the plurality of divisional islands respectively.

13. The memory device according to claim 10, wherein a second surface of the second chip has a plurality of conductive bumps, and the plurality of conductive bumps are coupled to the plurality of through-silicon vias respectively.

14. The memory device according to claim 10, wherein the peripheral circuit is disposed at a center of the first chip, and the peripheral circuit divides the first chip into a plurality of areas, each of the source line switches and each of the corresponding bit line switches, each of the page buffers, and each of the sensing amplifiers are disposed in one of the plurality of areas.

* * * * *